United States Patent
Hashemi et al.

(10) Patent No.: US 11,841,726 B2
(45) Date of Patent: Dec. 12, 2023

(54) LOW VOLTAGE HIGH PRECISION POWER DETECT CIRCUIT WITH ENHANCED POWER SUPPLY REJECTION RATIO

(71) Applicant: Apple Inc., Cupertino, CA (US)

(72) Inventors: Seyedeh Sedigheh Hashemi, Santa Clara, CA (US); Vahid Majidzadeh Bafar, Campbell, CA (US); Ali Mesgarani, Santa Clara, CA (US); Mansour Keramat, Los Gatos, CA (US)

(73) Assignee: Apple Inc., Cupertino, CA (US)

(*) Notice: Subject to any disclaimer, the term of this patent is extended or adjusted under 35 U.S.C. 154(b) by 366 days.

(21) Appl. No.: 17/181,950

(22) Filed: Feb. 22, 2021

(65) Prior Publication Data

US 2021/0247793 A1    Aug. 12, 2021

Related U.S. Application Data

(63) Continuation of application No. 16/288,253, filed on Feb. 28, 2019, now Pat. No. 10,928,846.

(51) Int. Cl.
*G05F 3/26* (2006.01)
*G05F 3/20* (2006.01)
*G11C 5/14* (2006.01)
*G11C 11/4074* (2006.01)

(52) U.S. Cl.
CPC ............... *G05F 3/26* (2013.01); *G05F 3/205* (2013.01); *G11C 5/147* (2013.01); *G11C 11/4074* (2013.01)

(58) Field of Classification Search
CPC ........... G05F 3/26; G05F 3/205; G11C 5/147; G11C 11/4074
See application file for complete search history.

(56) References Cited

U.S. PATENT DOCUMENTS

| | | | |
|---|---|---|---|
| 5,440,254 A | 8/1995 | Sundby | |
| 6,344,770 B1 * | 2/2002 | Zha | G05F 3/30 327/539 |
| 6,518,737 B1 * | 2/2003 | Stanescu | G05F 1/575 323/280 |
| 7,157,892 B1 | 1/2007 | Ritter | |

(Continued)

OTHER PUBLICATIONS

International Search Report and Written Opinion in PCT Appl. No. PCT/US2020/019464 dated Jul. 13, 2020, 11 pages.

*Primary Examiner* — Rafael O De Leon Domenech
(74) *Attorney, Agent, or Firm* — Kowert, Hood, Munyon, Rankin & Goetzel, P.C.; Erik A. Heter; Dean M. Munyon

(57) ABSTRACT

A power detect circuit is disclosed. A power detect circuit includes a voltage multiplier that receives an external supply voltage and generates a second supply voltage that is greater than the former. A voltage regulator is coupled to receive the second supply voltage and outputs a regulated supply voltage. A bandgap circuit is coupled to receive the second supply voltage when a first switch is closed, and the regulated supply voltage when a second switch is closed. The bandgap circuit generates a reference voltage for the voltage regulator, as well as one or more output voltages. A comparator circuit is coupled to receive the one or more output voltages from the bandgap circuit, and may compare these one or more output voltages to the regulated supply voltage.

20 Claims, 11 Drawing Sheets

(56) References Cited

U.S. PATENT DOCUMENTS

| | | | |
|---|---|---|---|
| 7,511,567 B2* | 3/2009 | Yeo | G05F 3/30 327/539 |
| 7,816,976 B2 | 10/2010 | Ogiwara et al. | |
| 7,982,550 B1* | 7/2011 | Quevy | H03L 7/16 331/66 |
| 8,638,084 B1* | 1/2014 | Abugharbieh | G05F 3/30 438/11 |
| 8,674,751 B2 | 3/2014 | Shi et al. | |
| 9,158,320 B1* | 10/2015 | Shrivastava | G05F 1/468 |
| 9,740,225 B1* | 8/2017 | Wong | G05F 1/468 |
| 10,726,881 B1* | 7/2020 | Stoerk | G05F 1/467 |
| 2005/0088163 A1 | 4/2005 | Tachibana et al. | |
| 2006/0170404 A1* | 8/2006 | Amrani | G05F 1/565 323/282 |
| 2006/0197611 A1* | 9/2006 | Yan | H03L 7/193 331/16 |
| 2008/0074173 A1* | 3/2008 | Tu | G05F 3/26 327/543 |
| 2008/0129271 A1 | 6/2008 | Fifield | |
| 2010/0164552 A1* | 7/2010 | Luria | G01K 7/01 377/55 |
| 2012/0249116 A1* | 10/2012 | Gagne | H02H 9/046 323/311 |
| 2013/0016965 A1* | 1/2013 | Christensen | H04B 10/0731 398/25 |
| 2013/0271207 A1* | 10/2013 | Shi | G11C 5/147 327/534 |
| 2014/0306751 A1* | 10/2014 | Nakamoto | G05F 1/10 327/541 |
| 2015/0222272 A1* | 8/2015 | Schatzberger | H03L 1/02 331/108 R |
| 2015/0333534 A1* | 11/2015 | Liu | H02J 5/00 307/104 |
| 2016/0067497 A1* | 3/2016 | Levine | A61B 5/4836 607/62 |
| 2016/0209860 A1 | 7/2016 | Yen et al. | |
| 2017/0102754 A1* | 4/2017 | Chi | G06F 1/10 |
| 2017/0139435 A1* | 5/2017 | Arnold | G05F 3/16 |
| 2017/0338069 A1* | 11/2017 | Reinhold | H02M 3/073 |
| 2018/0308843 A1* | 10/2018 | Schober | H01L 27/092 |

* cited by examiner

LOW VOLTAGE HIGH PRECISION POWER DETECT CIRCUIT WITH ENHANCED POWER SUPPLY REJECTION RATIO

RELATED APPLICATION

The present application is a continuation of U.S. application Ser. No. 16/288,253, filed Feb. 28, 2019 (now U.S. Pat. No. 10,928,846), the disclosure of which is incorporated by reference herein in its entirety.

BACKGROUND

Technical Field

This disclosure is directed to electronic circuits, and more particularly, to power detection circuits.

Description of the Related Art

High precision, low voltage power detect circuit are important components in many applications including power-on-reset (POR) circuit for various types of integrated circuit (ICs) such as a systems-on-a-chip (SoCs) or embedded processors, and voltage monitors for security applications. In advanced CMOS (complementary metal oxide semiconductor) processes, such power detect circuits may need to operate under extremely low supply voltages. Thus, the design of low voltage power detect circuits may account for these low supply voltages.

Power efficiency is another important metric in the design of ICs, such as the previously mentioned SoCs. Balancing power efficiency and performance may thus necessitate the use of high precision, low voltage power detect circuits. Accordingly, power detect circuits in modern technology may be designed to operate under very low supply voltages and with a high power supply rejection ratio (PSRR).

SUMMARY

A power detect circuit is disclosed. In one embodiment, a power detect circuit includes a voltage multiplier that receives an external supply voltage and generates a second supply voltage that is greater than the former. A voltage regulator is coupled to receive the second supply voltage and outputs a regulated supply voltage. A bandgap circuit is coupled to receive the second supply voltage when a first switch is closed, and the regulated supply voltage when a second switch is closed. The bandgap circuit generates a reference voltage for the voltage regulator, as well as one or more output voltages. A comparator circuit is coupled to receive the one or more output voltages from the bandgap circuit, and may compare these one or more output voltages to the regulated supply voltage.

In one embodiment, during a startup or in recovery from a voltage droop, a voltage monitor implemented in the power detect circuit may cause the first switch to close when the external supply voltage is less than a predetermined level. Upon the external supply voltage reaching/recovering to the predetermined level, the voltage monitor circuit may cause the first switch to open a second switch to close, thereby coupling the bandgap circuit to receive the regulated supply voltage.

In various embodiments, the bandgap circuit may include current mirror circuitry having a number of branches and chopping circuitry. The chopping circuitry may perform a chopping operation, selecting the various branches in a sequence in accordance with a sequence generator coupled thereto. The bandgap circuit may also, in various embodiments, include a startup circuit to enable faster startup in generation of the various voltages by the bandgap circuit.

BRIEF DESCRIPTION OF THE DRAWINGS

The following detailed description makes reference to the accompanying drawings, which are now briefly described.

Figure 1:
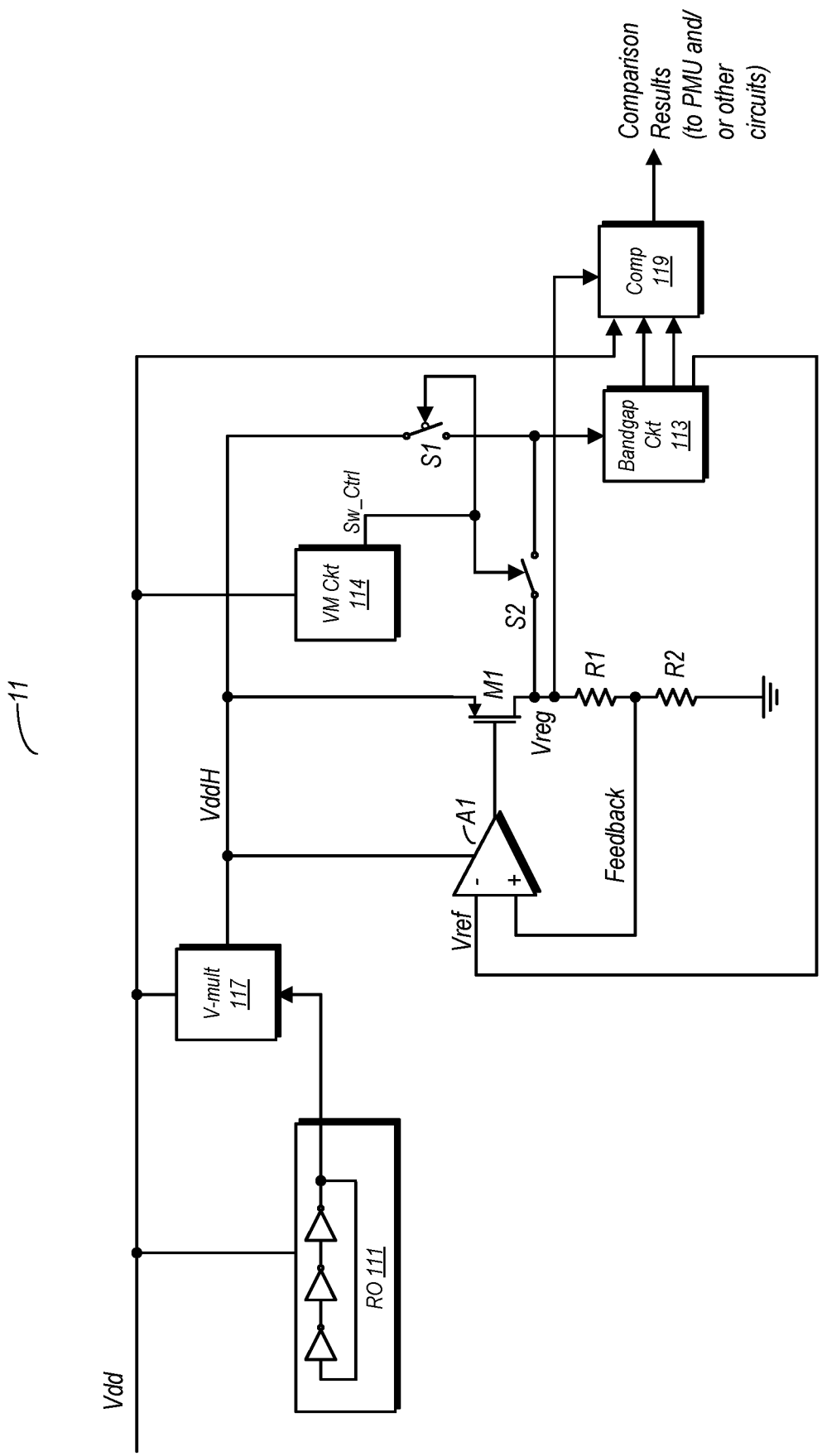
FIG. 1 is a schematic diagram of one embodiment of a power detect circuit.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation [entity] configured to [perform one or more tasks] is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to a power detect circuit as well as various circuits implemented therein. In various embodiments, a power detect circuit includes a voltage multiplier coupled to receive a supply voltage from a source external to the circuit. The voltage multiplier may generated a second supply voltage that is greater (e.g., double) than that of the external supply voltage. The second supply voltage is coupled to a voltage regulator within the power detect circuit, and generates a regulated supply voltage. A bandgap circuit is coupled to receive either the second supply voltage or the regulated supply voltage, dependent upon a level of the external supply voltage. The bandgap circuit may generate a reference voltage for the voltage regulator, and may further generate one or more additional output voltage provided to a comparator of the power detect circuit. The comparator circuit may, in turn, compare the voltage(s) received from the bandgap circuit to the external supply voltage.

In some embodiments, the voltage multiplier of the power detect circuit is a switched capacitor voltage multiplier. The power detect circuit may further include a ring oscillator for generating a periodic signal provided to the switched capacitor multiplier in order to control the opening and closing of the various switches therein.

Some embodiments of the power detect circuit include a voltage monitor circuit, which itself includes a low voltage (LV) detection circuit and a very low voltage (VLV) detection circuit, which may be cascaded together with the VLV detection circuit providing the output. The voltage monitor circuit may be coupled to receive the external supply voltage. During operation of the power detect circuit, e.g., during startup, the VLV detection circuit may output a signal in a first state to cause a first switch to be closed and a second switch to be opened. The first switch, when closed, couples the second supply voltage to the bandgap circuit. When the output signal from the VLV detection circuit is in a second state, the first switch is open and the second switch is closed. When closed, the second switch coupled the regulated supply voltage to the bandgap circuit.

In one embodiment, the bandgap circuit includes current mirror circuitry having a number of branches, including a reference current branch and additional branches. The bandgap circuit further includes chopping circuitry configured to perform chopping on the various branches of the current mirror circuitry, including the reference current branch. A sequence generator, operating in accordance with a received clock signal, may generate a sequence for which the various branches of the current mirror circuitry are selected. In some embodiment, the clock signal received by the sequence generator may be a multi-phase clock signal. Using this chopping technique, the bandgap circuit may generate a number of voltages, including a reference voltage that is provided to the voltage regulator. Furthermore, at least one voltage generated by the bandgap circuit may be output through a filter (e.g., a notch filter), which is used to smooth out any ripple that may be introduced by the chopping operation.

The bandgap circuit includes a startup circuit implemented to reduce both startup and recovery time. The startup circuit may include first and second current branches. The first current branch may be active at any time when the second (boosted) supply voltage is less than a certain value. The second current branch may be activated during startup or recovery for a limited time when the external supply voltage initially exceeds a threshold voltage of a transistor in the circuit. The limited time is enforced in part by a delay element, which determines the duration that the second branch is active.

The power detect circuit as disclosed herein may be useful in applications in which the supply voltages are very low (e.g., 0.4 volts, and less than 1.0 volt, generally) in which high precision and a high power supply rejection ratio (PSRR) is desired. Some applications for the circuit may include (but are not limited to) power-on-reset circuits, voltage monitors for hardware security protection, and general voltage monitors that may be used with power management circuitry. Various embodiments of the power detect circuit and the various sub-circuits implemented therein are now discussed in further detail.

Power Detect Circuit:

Turning now to FIG. 1, a schematic diagram of one embodiment of a power detect circuit is shown. Power detect circuit 11 of FIG. 1 is coupled to receive a supply voltage Vdd from a source external thereto. The source of Vdd may be on an integrated circuit die upon which power detect circuit is implemented, or may be external thereto. Such sources may include another voltage regulator (separate from that included in power detect circuit 11), other power supply circuitry, or, e.g., a battery or other source.

In the embodiment shown, Vdd is provided to three different sub-circuits of power detect circuit 11, namely a ring oscillator 111, a voltage multiplier 117, and a comparator 119. Ring oscillator 111 in the embodiment shown is configured to generate a periodic signal (e.g., a clock signal) that is provided to voltage multiplier 117. In this embodiment, voltage multiplier 117 is a switched capacitor voltage multiplier, with the switches thereof operating under control of the clock signal provided from voltage multiplier 117. Using voltage multiplier 117, a second supply voltage, VddH, is generated. The second supply voltage is greater than the first. For example, in one embodiment, the voltage VddH may be double that of Vdd. Establishing the second supply voltage may provide more voltage headroom for the operation of other circuitry by which it is received.

Power detect circuit 11 in the embodiment shown includes a voltage regulator circuit. As shown here, the voltage regulator is a low dropout (LDO) regulator, and includes amplifier A1 (which is coupled to receive VddH), a pass transistor M1 (which is coupled to receive VddH on its source terminal), and a voltage divider that includes resistors R1 and R2. The voltage divider in the embodiment shown generates a feedback voltage ('Feedback') provided to the non-inverting input of amplifier A1. A reference voltage is provided to amplifier A1 from bandgap circuit 113, which is discussed in further detail below. Amplifier A1 generates an error signal based on a difference between the feedback voltage and the reference voltage. This error signal is driven onto the gate terminal of M1, which is a PMOS device in this particular embodiment, but can be an NMOS in other embodiments contemplated within the scope of this disclosure. The output of the voltage regulator is a regulated supply voltage, Vreg, that is provided from the drain terminal of M1 for the embodiment of FIG. 1. This regulated supply voltage is provided to at least one comparator circuit 119, and may also be provided to bandgap circuit 113.

Bandgap circuit 113 in the embodiment shown may receiver during operation one of two different supply voltages, dependent upon the respective positions (open or closed) of switches S1 and S2. When switch S1 is closed (and switch S2 is open), bandgap circuit 113 receives VddH from voltage multiplier 117. When switch S2 is closed (and switch S1 is open), bandgap circuit 113 receives the regulate supply voltage, Vreg. Control of these switches is performed by voltage monitor circuit 114, and in particular, a control signal generated by and output therefrom.

Voltage monitor circuit 114 in the embodiment shown is coupled to receive the external supply voltage, Vdd, and may generate a switch control signal, Sw_Ctrl, based on a current level thereof. In the embodiment shown, if the external supply voltage Vdd is less than a certain value, voltage monitor circuit 114 may output the switch control signal in a first state that causes switch S1 to close while switch S2 is held open. In this open loop configuration, bandgap circuit 113 is coupled to receive the second supply voltage, VddH. When the external supply voltage Vdd exceeds a certain voltage, voltage monitor circuit 114 may output the switch control signal in a second state that causes switch S2 to close while switch S1 is held open. Accordingly, when S2 is closed and S1 is open, bandgap circuit 113 operates in a closed loop configuration and receives the regulated supply voltage, Vreg. When bandgap circuit 113 is operating under the regulated supply voltage, the precision of the voltages generated thereby may be improved. Furthermore, this arrangement may allow for improved PSRR with respect to operation of circuits such as bandgap circuit 113 and comparator 119.

Bandgap circuit 113 in the embodiment shown is arranged to generate at least one output voltage, and may generate additional ones as well. As shown in FIG. 1, a reference voltage, Vref, is provided from bandgap circuit 113 to the inverting input of amplifier A1. Bandgap circuit 113 is further coupled to provide one or more output voltages to comparison circuitry, comparator 119, for use in comparison operation. In this embodiment, comparator 119 is further coupled to receive the external supply voltage Vdd, and also receives the regulated supply voltage Vreg as a source of power. Comparator 119 may perform comparisons of the voltage(s) received from bandgap circuit 113 to the external supply voltage Vdd, and may generate comparison results that are forwarded to, e.g., a power management unit or other circuitry. It is noted that while only one instance of a comparator 119 is shown here, multiple instances may be implemented in some embodiments. Alternatively, in some embodiments comparators 119 may include multiple circuits implemented therein for performing voltage comparisons and generating signals based thereon to perform various power control actions or otherwise provide information regarding the operation of the various power supplies.

During a startup operation, voltage monitor circuit may initially cause switch S1 to close while holding switch S2 open while the external supply voltage, Vdd, rises. Upon Vdd reaching a sufficient level, as determined by voltage monitor circuit 114, the state of the output signal therefrom may change to cause switch S2 to close and open switch S1. Similar operation may occur after a significant drop in the supply voltage, or responsive to certain changes in the supply voltage. For example, in some applications, power detect circuit 11 may be coupled to a variable voltage rail upon which the supply voltage may be changed during system operation (e.g., for increased performance, for power savings, etc.). Some voltage changes may therefore be predictable, while in other applications (e.g., security), such voltage changes are not predictable. Accordingly, the design of power detect circuit 11 may take these factors into account in order to ensure stable operation across a number of voltages, as well as across changes to the supply voltages.

Figure 2:
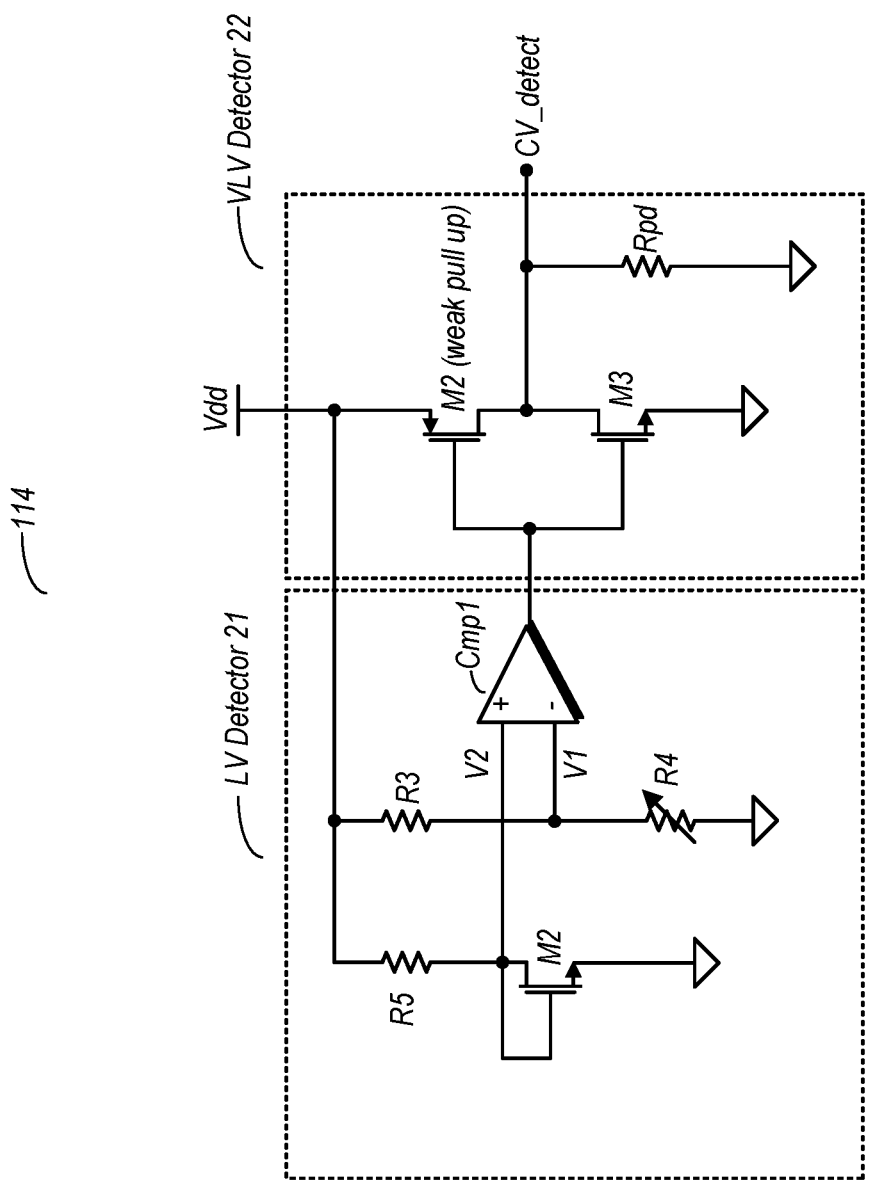
FIG. 2 is a schematic diagram of one embodiment of a voltage monitor circuit implemented in an embodiment of a power detect circuit.

Voltage Monitor Circuit:

Turning now to FIG. 2, a schematic diagram of one embodiment of a voltage monitor circuit 114 is shown. In the embodiment shown, voltage monitor 114 includes two circuits, low voltage (LV) detector 21 and very low voltage (VLV) detector 22. These two circuits are arranged in a cascaded configuration, with VLV detector 22 providing the output signal, CV_detect, of voltage monitor 114.

VLV detector 22 in the embodiment shown includes an inverter circuit implemented using PMOS device M2 and NMOS device M3. The output node of the circuit is coupled to a pulldown resistor Rpd. Meanwhile, transistor M2 implements a weak pull up. During an initial startup (or after a significant voltage drop), the output from LV detector 21, and thus the input to VLV detector 22, cannot be guaranteed to be in a particular state (more particularly, the output of the comparator, Cmp1, cannot be guaranteed). Thus, when the external supply voltage Vdd is very low (e.g., less than a source-gate threshold voltage of M2), the pulldown resistor Rpd acts to pull CV_detect low. The resistance of resistor Rpd may further be selected such that the CV_detect may be pulled low even when transistor M2 enters the subthreshold region of operation. This arrangement may guarantee that voltage monitor 114 outputs a logic 0 when the external supply voltage is less than a certain value.

As shown in FIG. 2, LV detector 21 includes comparator Cmp1, a voltage divider including resistors R3 and R4 to generate a first voltage for comparison, V1, and another circuit leg that includes transistor M2 and resistor R5 for generation of the second voltage for comparison, V2. It is noted that R4 is shown here as a variable resistor, although this resistor may also be trimmed in order to provide the desired voltage at V1.

LV detector 21 in the embodiment shown is configured to compare the two different voltages, V1 (provided to the inverting input of comparator Cmp1) and V2 (provided to the non-inverting input of comparator Cmp1. These voltages both rise as Vdd rise, although the characteristics of these voltage increases are different. More particularly, V1 may rise as a linear function of the rise of Vdd, while V2 rises as a non-linear function of Vdd. When V2>V1, Cmp1 outputs a high voltage that exceeds the threshold voltage of transistor M3 in the VLV detector 22. Accordingly, M3 is activated to pull the CV_detect node low. As Vdd rises, the voltage curve of V2 (expressed graphically) tends to flatten out. Meanwhile, V1 continues to rise linearly with Vdd. Accordingly, at the point where the level of V1 meets or exceeds that of V2, Cmp1 outputs a voltage level equivalent to a logic 0. This in turn causes activation of transistor M2, which pulls CV_detect high. Thus, when voltage monitor 114 is implemented in an embodiment of the circuit shown in FIG. 1, the logic 1 output of CV_detect serves as a control signal to couple the regulated supply voltage to the bandgap circuit, while causing the boosted supply voltage (e.g., VddH) to be disconnected.

Figure 3:
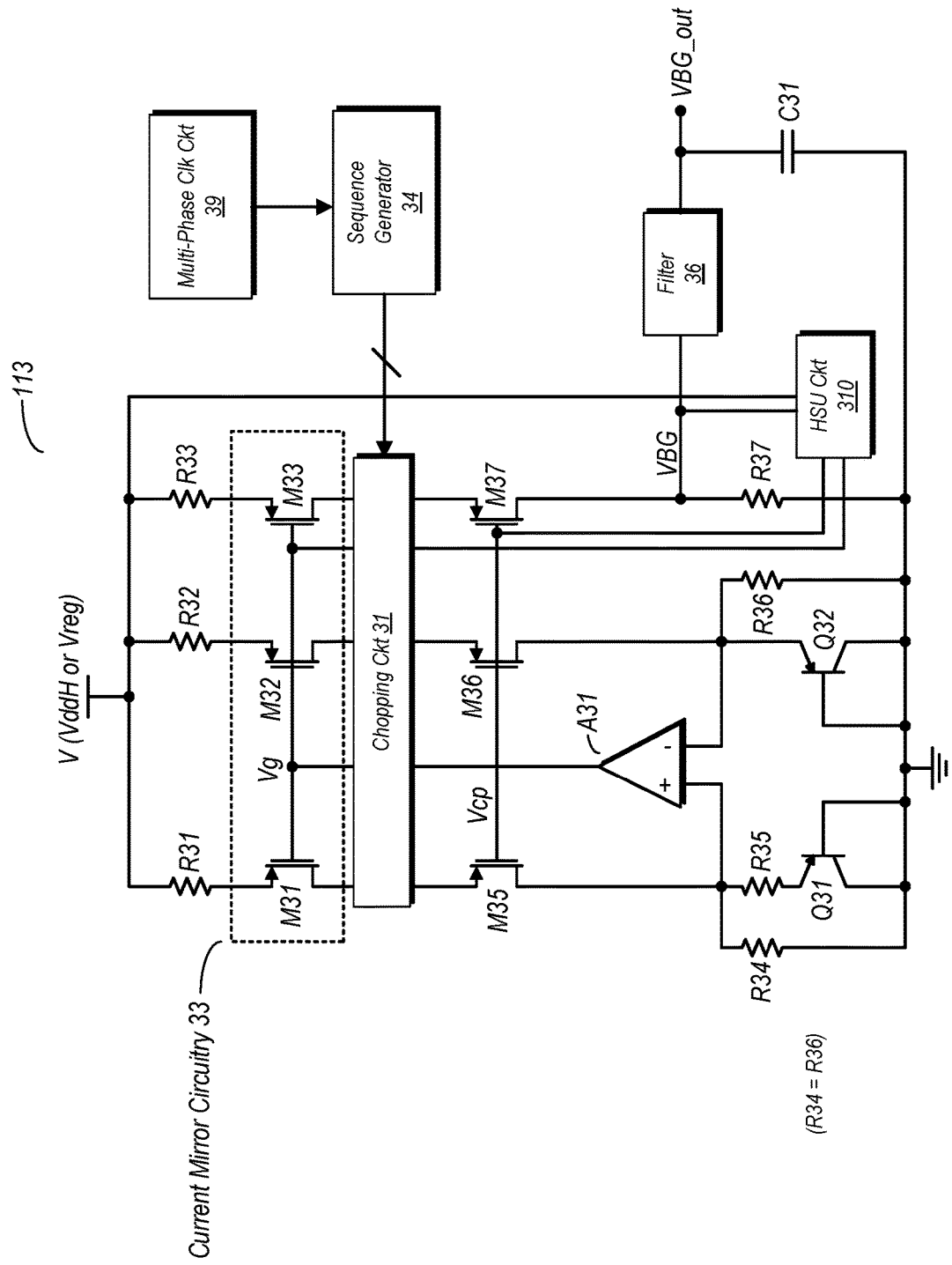
FIG. 3 is a schematic diagram of one embodiment of a bandgap circuit implemented in an embodiment of a power detect circuit.

Bandgap Circuit, Startup Circuit, and Output Filter:

FIG. 3 is a schematic diagram of one embodiment of a bandgap circuit usable in various embodiment of the power detect circuit illustrated in FIG. 1. Bandgap circuit 113 in the embodiment shown uses chopper stabilization in combination if passive degeneration in the generation of voltages and the minimization of ripple at the output.

In the embodiment shown, bandgap circuit 113 includes current mirror circuitry 33 that includes transistors M31, M32, and M33, which are coupled to resistors R31, R32, and R33, respectively. In this particular embodiment, the circuit branch including M33 provides the reference current that is mirrored in the other circuit branches. Transistors M35, M36, and M37 are also each implemented in one of the circuit branches. An amplifier A31 includes inputs coupled to two of the three branches. Additionally, bipolar transistors Q31 and Q32 are also included in bandgap circuit 113. The emitter of Q32 in the embodiment shown is directly coupled to the inverting input of A31. The non-inverting input of A31 is coupled to resistor R35, which is coupled to the emitter of Q31. Bandgap circuit 113 also includes resistors R34, R36, and R37, wherein R34 and R36 are substantially equal in value in one particular embodiment. Although shown here as a single resistor, R37 may, in some embodiments, be implemented as a resistor ladder, and may further be tunable. In such embodiment, this resistor ladder may be utilized as a source for additional voltages output by the bandgap circuit, including various threshold voltages used as a basis for comparison.

Chopping circuit 31 in the embodiment shown is coupled across the three branches of the current mirror circuitry. Selection of the branches is performed under the control of sequence generator 34. In one embodiment, sequence generator 34 is a zero-average sequence generator, which provides an equal probability over time that transistors of each transistor pair shown (e.g., M31 and M35, etc.) are connected to each other for substantially equal amounts of time. This may allow for a uniform distribution of errors that may be present due to mismatches between the devices. Sequence generator 34 operates with a multi-phase clock signal received from multi-phase clock circuit 39. During operation, the various branches are selected in accordance with the sequence generated by sequence generator 34. As a result, the bandgap voltage generated on node VBG may have some undesired ripple. Accordingly, this bandgap voltage is input to filter 36, which filters out the ripple and provide the final output voltage on VBG out. In addition to this being the final output voltage, the voltage present on VBG out may also be supplied as the reference voltage, Vref, to the voltage regulator shown in FIG. 1. Any remaining AC components in this final output voltage may be shunted to ground through capacitor C31. In one embodiment, filter 36 is a switched capacitor filter, although other embodiments may use different types of filters. An embodiment of a switched capacitor filter is discussed below.

During operation, fluctuations in the supply voltages can cause glitches in the voltages generated by the bandgap circuit, and may even lead to complete shutdown if a supply voltage falls below a certain limit. Thus, recovery time may be an important factor in many applications of the circuitry described herein. Bandgap circuit 113 thus includes a hybrid startup circuit 310 (or, hereinafter, 'startup circuit'). This circuit may reduce the recovery time in the event of glitches and other voltage fluctuations that may be introduced into bandgap circuit 113. One embodiment of a startup circuit is now discussed in further detail.

Figure 4:
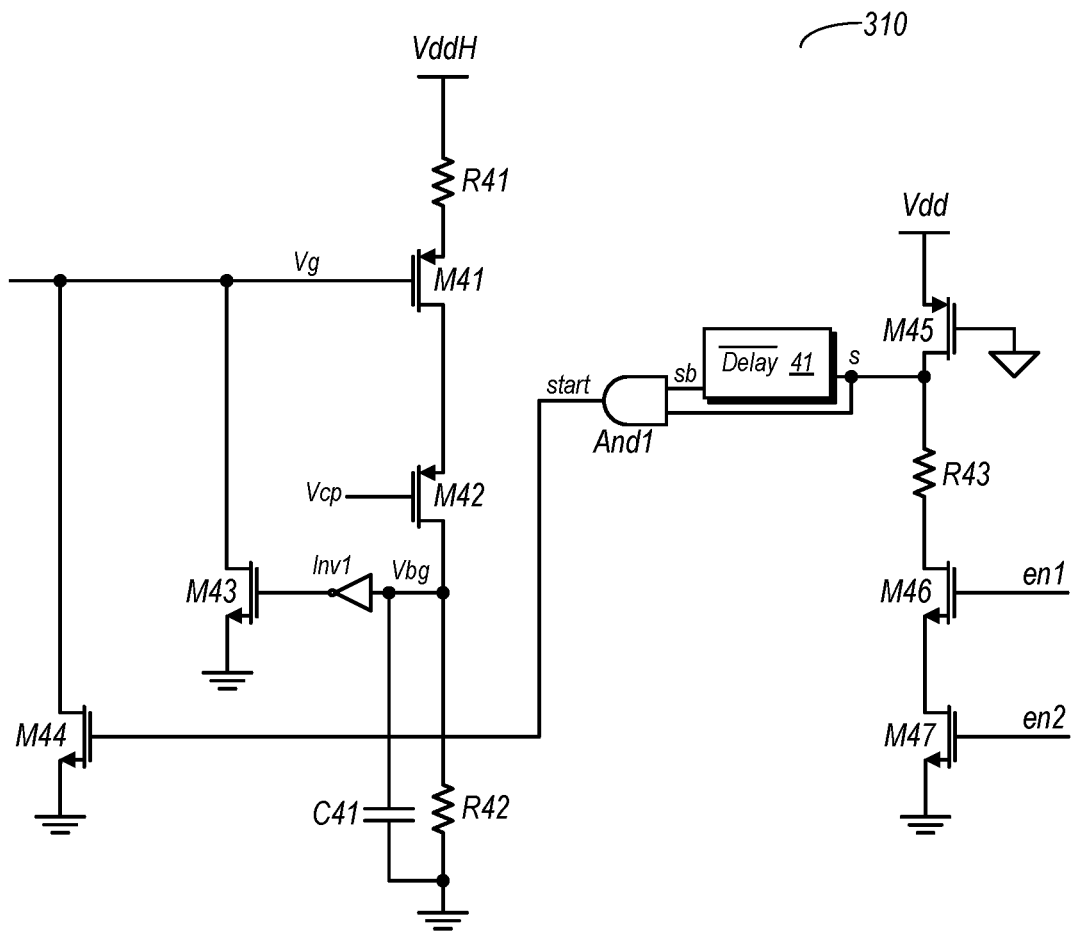
FIG. 4 is a schematic diagram of one embodiment of a startup circuit implemented in an embodiment of a bandgap circuit and a timing diagram illustrating its operation.
Figure 4:
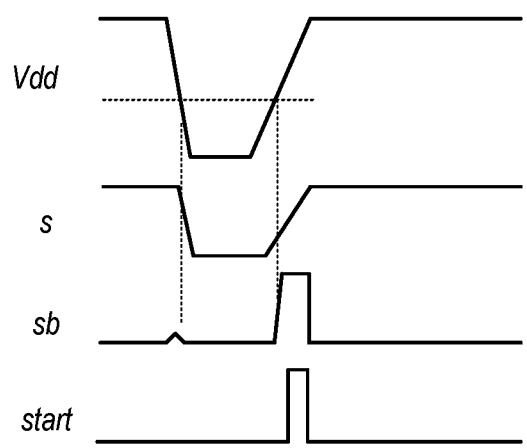

FIG. 4 is a schematic diagram of one embodiment of a startup circuit implemented in an embodiment of a bandgap circuit and a timing diagram illustrating its operation. Startup circuit 310 as shown herein may be used in the bandgap circuit discussed above, as well as in other circuits in which such a startup circuit is useful.

Startup circuit in the embodiment shown includes two current branches, a first including transistor M43 and a second including transistor M44. A third circuit branch includes resistors R41 and R42 along with transistors M41 and M42. In this embodiment shown, the gate terminal of M41 is coupled to the Vg node of the bandgap circuit discussed above, while the gate terminal of M42 is coupled to the Vcp node of the same circuit. Although not shown here, the Vcp node is coupled to a bias voltage generation circuit which generates the voltage for this node. Resistor R42 is coupled in parallel with a capacitor C41, between the Vbg node and ground. The gate terminal of M42 is coupled to an output of inverter Inv1, which in turn is coupled to drive the gate terminal of M43.

Control of the second current branch (of M44) is performed by the circuitry on the right hand side of the schematic. This portion includes a circuit branch including transistors M45, M46, and M47, along with resistor R43. The gate terminals of M46 and M47 in this embodiment are coupled to receive enable signals en1 and en2, respectively, which may be provided from a control circuit that is not shown here. An inverting delay element 41 and an AND gate, And1, are also part of the circuitry that controls the current branch of M44.

M45 in the embodiment shown is a PMOS transistor having a gate terminal coupled to a ground node, and a source terminal coupled to Vdd (which is the external supply voltage in the circuits of FIGS. 1-3). When Vdd rises above the source-gate threshold voltage, M45 is activated and the node coupled to its drain terminal ('s') is pulled up. This provides a logic 1 directly to one terminal of And Meanwhile the other terminal, coupled to node sb, is also a logic 1 at this time, and thus causes And1 to assert the start signal. When the start signal is asserted, M44 is activated. Meanwhile, as long as Vbg is at a voltage equivalent to a logic 0, the output of Inv1 activates M43. With both M43 and M44 active, current is drawn through these devices from node Vg. After the delay time has elapsed, node sb flips from a logic 1 to a logic 0 (since delay element 41 is an inverting delay element). Thus, since the output from And1 at this time falls to a voltage level equivalent to a logic 0, M44 is deactivated, and this branch draws no more current. However, the brief period of which current is drawn through M44 may significantly reduce the amount of time to start up the bandgap circuit that startup circuit 310 is implemented in one embodiment. Similar operation in other applications is possible and contemplated.

The operation described in the previous paragraph is graphically illustrated in the timing diagram of FIG. 4, in the context of a voltage droop. After Vdd has fallen and begins rising again, nodes s and sb both reach a point where they are at logically equivalent value. This causes assertion of the start signal, which remains so until the delay time has elapsed. Thereafter, sb falls, as does the start signal.

Operation of the other current branch continues the voltage on node Vbg has risen to a point in which it is equivalent to a logic 1. Thereafter, inverter Inv1 outputs a voltage equivalent to a logic 0, which causes deactivation of M43, thereby completing the startup operation performed by startup circuit 310.

Figure 5:
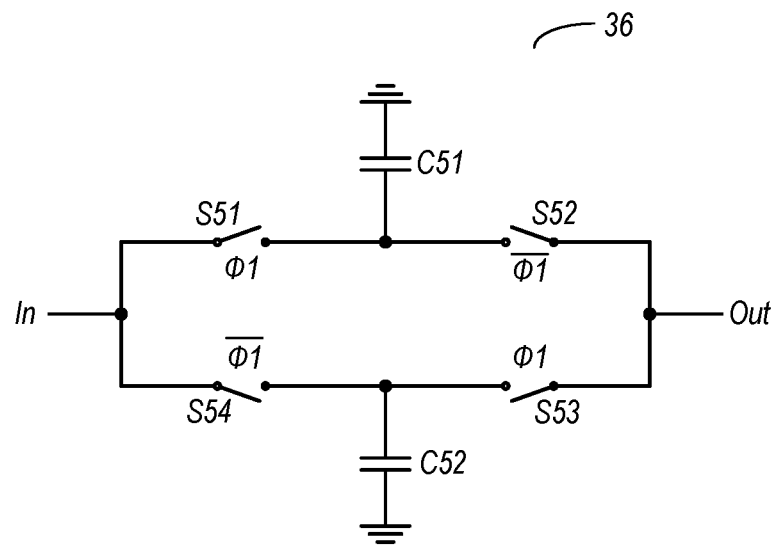
FIG. 5 is a schematic diagram of one embodiment of a switched capacitor filter implemented in an embodiment of a bandgap circuit and a timing diagram illustrating its operation.
Figure 5:
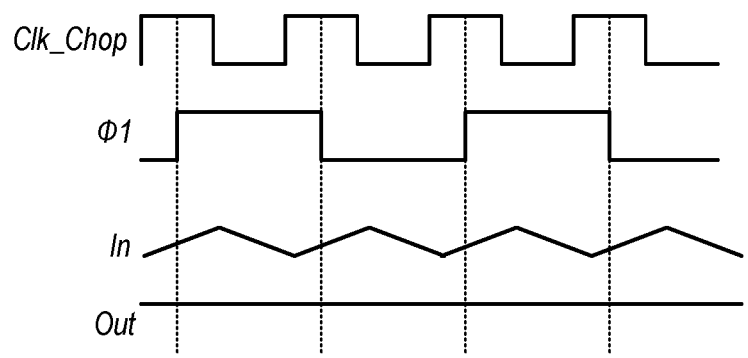

FIG. 5 is a schematic diagram of one embodiment of a switched capacitor filter implemented in an embodiment of a bandgap circuit and a timing diagram illustrating its operation. In the embodiment shown, switched capacitor filter 36 includes two capacitors, C51 and C52, which are each coupled between the main portion of the filter and a ground node. The switched capacitor filter further includes switches S51, S52, S53, and S54, which are implemented in the signal paths between the input node, In, and the output node, Out. The switches are operated in accordance with a clock signal, Clk_Chop. Switches S51 and S53 are closed during first phase of the signal Φ1 (e.g., active portion) while switches S52 and S54 are closed during a second phase of the signal Φ1 (e.g., inactive portion).

The effect of the operation of switched capacitor filter 36 is shown in the timing diagram at the bottom of FIG. 5. The switch control signal, Φ1, switches during each high cycle of the clock signal Clk_Chop. The ripple on the input voltage is shown here as a sawtooth wave, while the output is shown as stable and with the ripple removed.

Figure 6:
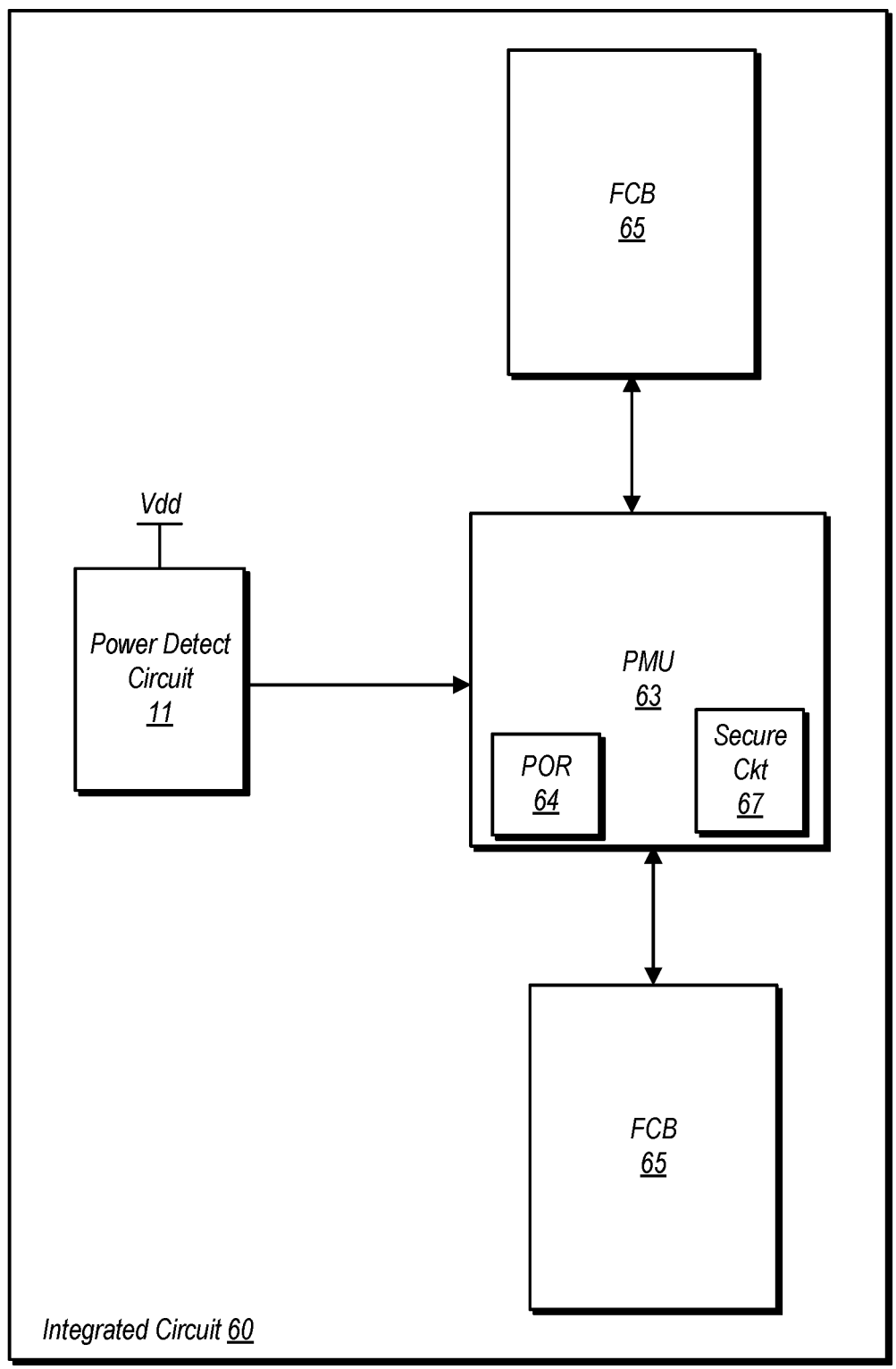
FIG. 6 is a block diagram of one embodiment of an integrated circuit having a power management circuit and a power detect circuit.

IC with Power Detect Circuit:

FIG. 6 is a block diagram of one embodiment of an IC having a power detect circuit in accordance with the disclosure. It is noted that IC 60 as shown in FIG. 6 is a simplified example provided for illustrative purposes, and is not intended to be limiting.

IC 60 in the embodiment shown includes a power detect circuit 11 coupled to a power management unit (PMU) 63. In turn, PMU 63 is coupled to two functional circuit blocks 65, which my implement circuitry of virtually any type. PMU 63 in the embodiment shown comprises circuitry that may carry out various power management functions. Such functions may include clock gating, power gating, supply voltage changes in accordance with performance state changes, power on resets, and so forth. Furthermore, PMU 63 may use the information provided by power detect circuit 11 to determine whether or not to carry out certain power control actions.

Figure 7:
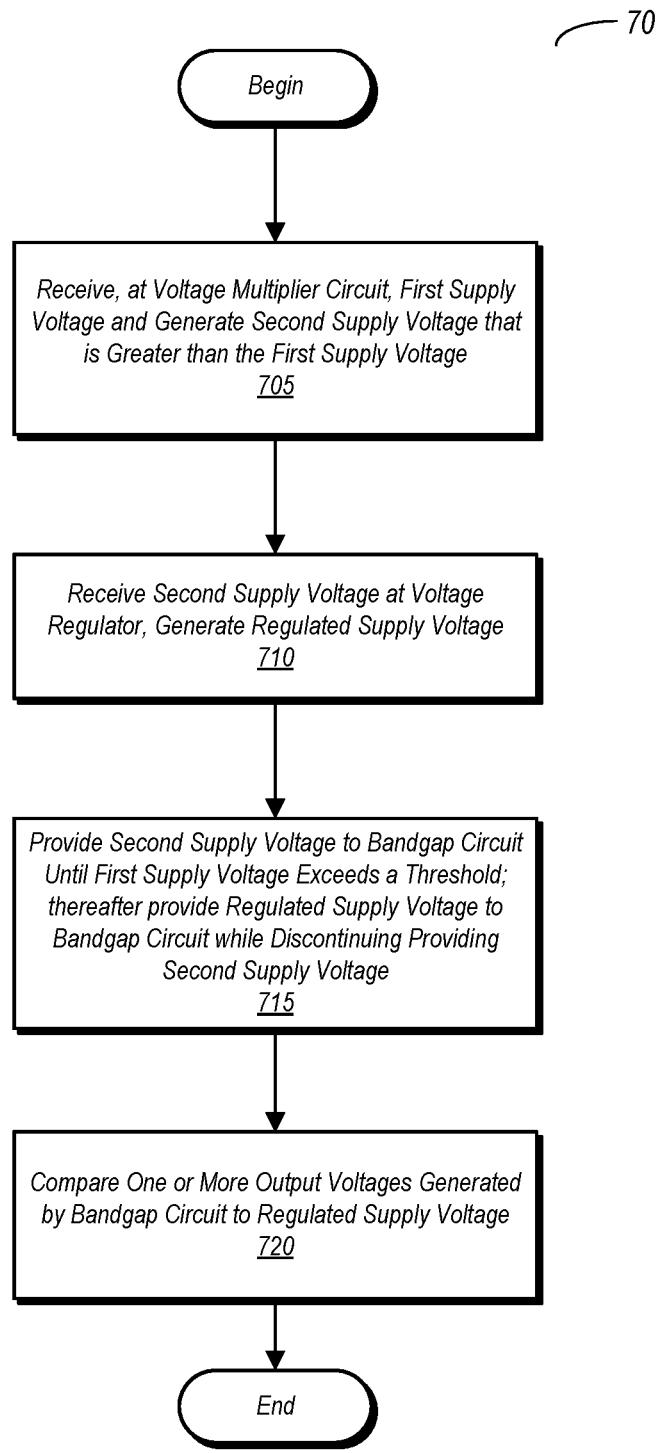
FIG. 7 is a flow diagram illustrating one embodiment of a method for operating a power detect circuit.

Methods of Operation:

FIG. 7 is a flow diagram illustrating one embodiment of a method for operating a power detect circuit. Method 700 as discussed herein may be performed using power detect circuit shown in FIG. 1 and various embodiment thereof. Power detect circuits not explicitly discussed herein but capable of performing method 70 may fall within the scope of this disclosure.

Method 70 begins with a voltage multiplier circuit receiving a first supply voltage and generating a second supply voltage based on the first supply voltage, the second supply voltage being greater than the first supply voltage (block 705). Method 700 further includes a voltage regulator circuit receiving the second supply voltage and generating a regulated output voltage (block 710). The method continues by providing the second supply voltage to a bandgap circuit responsive to the first supply voltage being below a first threshold, and thereafter, responsive to the first supply voltage exceeding the first threshold, providing the regulated supply voltage to the bandgap circuit and discontinuing providing the second supply voltage to the bandgap circuit (block 715). Method 700 further includes comparing, using a comparator circuit, the regulated supply voltage to at least one output voltage provided by the bandgap circuit (block 720).

Method 70 as discussed above is a generalized method of operating a power detect circuit in accordance with this disclosure. The full method may be performed during a startup of a system or IC that includes an embodiment of the power detect circuit discussed above, or responsive to a voltage droop which causes switching of the bandgap power source from the regulated supply voltage back to the second (boosted) supply voltage. Moreover, additional methods for operating individual circuits within an embodiment of a power detect circuit may also be performed within, or in conjunction with, method 700 as described herein. Some of these methods are discussed below.

Figure 8:
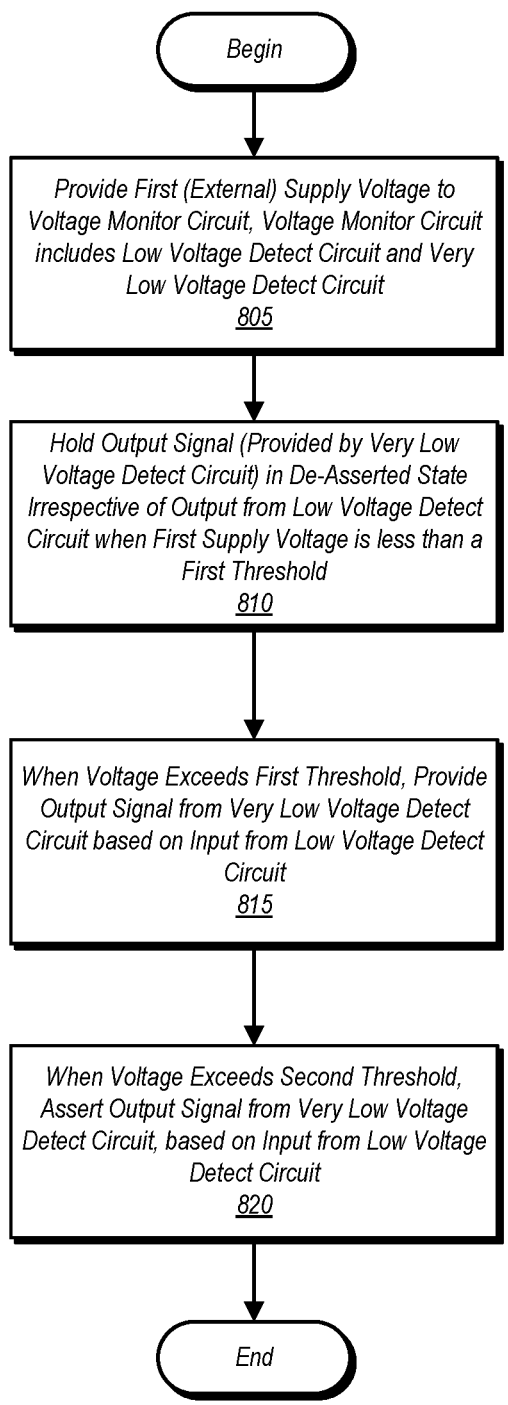
FIG. 8 is a flow diagram illustrating one embodiment of a method for operating a voltage monitor circuit.

FIG. 8 is a flow diagram illustrating one embodiment of a method for operating a voltage monitor circuit. Method 80 may be performed using various embodiments of a voltage circuit as discussed herein, as well as with embodiments not explicitly discussed herein but nevertheless falling within the scope of this disclosure. Furthermore, while method 800 may be performed in conjunction with the operation of a power detect circuit as discussed herein, it is possible and contemplated that method 800 may also be performed in other applications as well.

Method 80 begins with the providing of a first (external) supply voltage to a voltage monitor circuit that includes a low voltage (LV) detect circuit and a very low voltage (VLV) detect circuit (block 805). The method further includes holding the output signal of the voltage monitor circuit (provided by the VLV circuit) in a de-asserted state, irrespective of an output from the LV detect circuit, when the first supply voltage is less than a first threshold (block 810). It is noted that in one embodiment, the LV detect circuit and VLV detect circuit are arranged in a cascaded configuration, with the LV detect circuit providing its output signal to the VLV detect circuit. When the first supply voltage is below a certain level, the output signal provided by the LV detect circuit cannot be guaranteed to be in a correct state. Accordingly, the VLV detect circuit is arranged such that its output signal will be in the correct state even when that of the LV detect circuit is not, due to a low supply voltage.

When the voltage exceeds the first threshold, an output signal is provided from the VLV detect circuit based on an input received from the LV detect circuit (block 815). As the voltage rises, it may eventually exceed a second threshold. When the voltage exceeds the second threshold, an output signal is asserted from the VLV detect circuit, based on an input received from the LV detect circuit (block 820).

When used in an embodiment of a power detect circuit such as that shown in FIG. 1, the voltage monitoring circuit can control switches that are used to determine which power supply (e.g., a boosted supply and a regulated supply) are provided to a bandgap circuit. Accordingly, method embodiments are possible and contemplated in which include a voltage monitoring circuit controlling switches to couple/decouple power supplies to a bandgap circuit.

Figure 9:
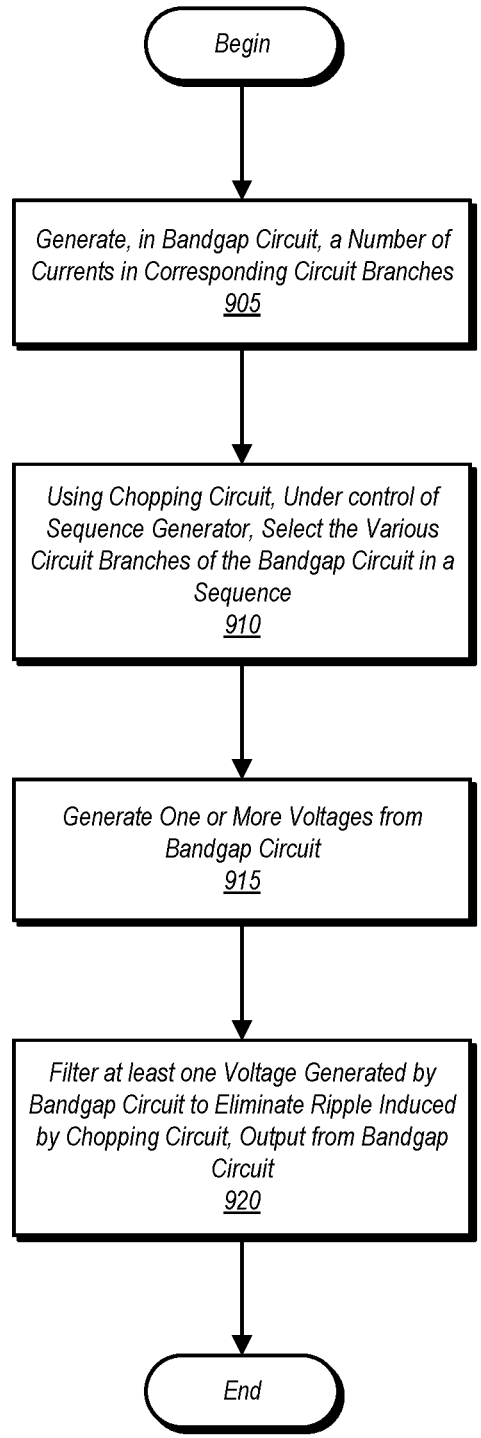
FIG. 9 is a flow diagram illustrating one embodiment of a method for operating a bandgap circuit.

FIG. 9 is a flow diagram illustrating one embodiment of a method for operating a bandgap circuit. Method 90 as shown here may be used with various embodiments of the bandgap circuit discussed above. While the method of operation may be performed within the context of the power detect circuit disclosed herein, method 90 (and the bandgap circuit itself) are not limited to such applications. Furthermore, embodiments of a bandgap circuit not explicitly discussed herein, but nevertheless capable of performing method 90, may fall within the scope of this disclosure.

Method 90 begins with generating, in a bandgap circuit, a number of currents in each of a corresponding number of circuit branches (block 905). Using a chopping circuit under control of a sequence generator, method 90 continues with the selection of the various ones of the circuit branches in a sequence (block 910). The various circuit branches may form current mirror circuitry, with one branch establishing the reference current. During operation, the chopping operation may include chopping of the reference current branch.

Based on the chopping operation described above, method 90 further includes generating one or more voltages in the bandgap circuit (block 915). The method further includes filtering at least one voltage generated by the bandgap circuit to eliminate ripple induced by the chopping circuit, and outputting this voltage from the bandgap circuit (block 920).

Figure 10:
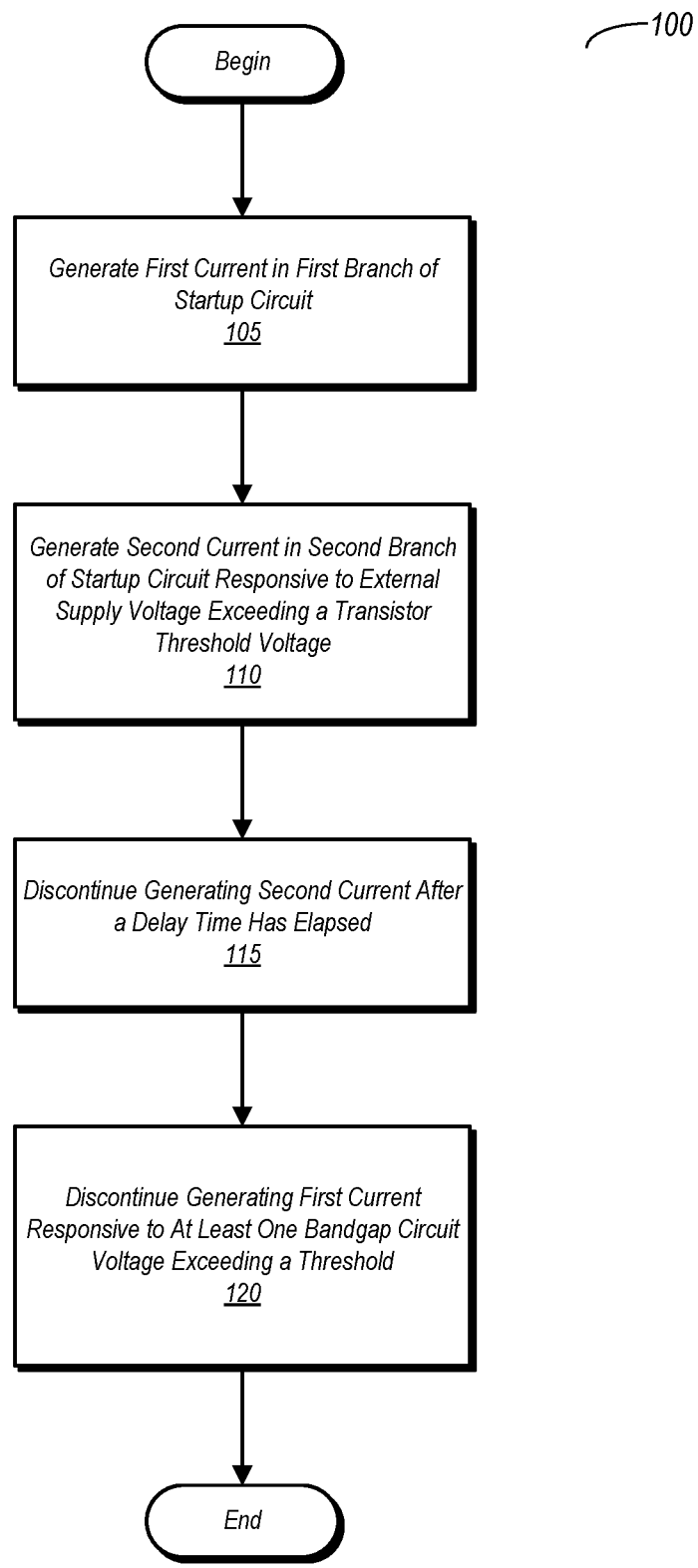
FIG. 10 is a flow diagram illustrating operation of one embodiment of a startup circuit.

FIG. 10 is a flow diagram illustrating operation of one embodiment of a startup circuit. Method 100 may be performed with various embodiments of the startup circuit discussed above. While the method of operation may be performed within the context of the power detect circuit disclosed herein, the method (as well as the circuit itself) is not limited to such application. Furthermore, startup circuits capable of performing method 100 but not explicitly discussed herein may fall within the scope of this disclosure.

Method 100 includes the generation of a first current in a first branch of a startup circuit (block 105). The method further includes generating a second current in a second branch of a startup circuit responsive to an external supply voltage exceeding a transistor threshold voltage (block 110). Providing current from two current branches may provide extra current to the circuit to which the startup circuit is coupled, thereby accelerating the startup process. Method 100 further includes discontinuing generation of the second current after a delay time has elapsed. Generation of the first current may be discontinued after at least one bandgap circuit voltage provided to the startup circuit has exceeded a threshold.

Example System

Figure 11:
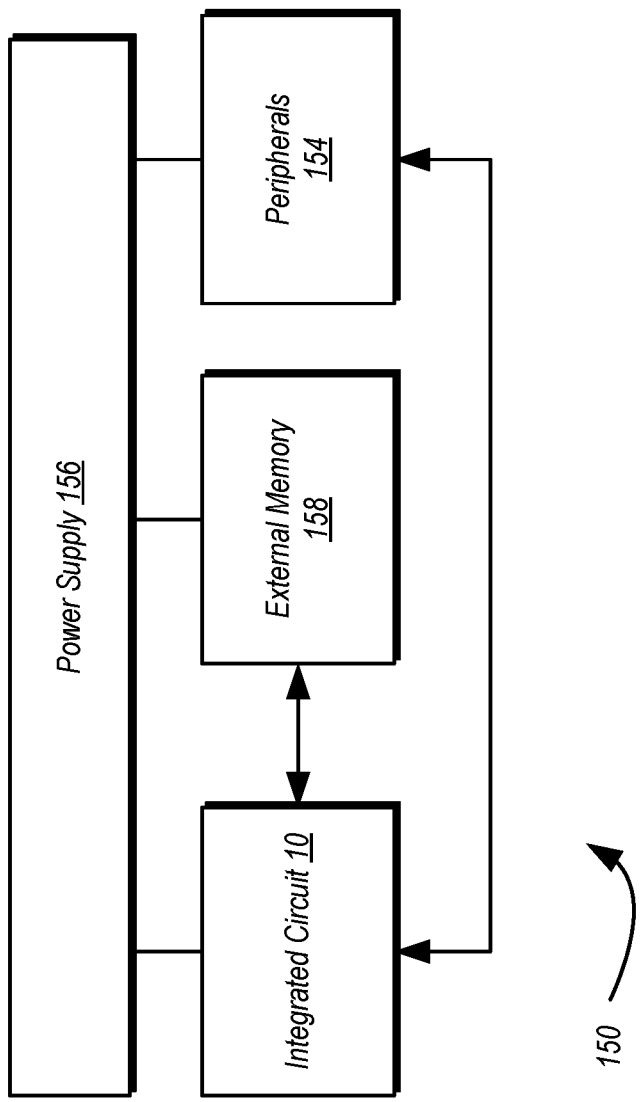
FIG. 11 a block diagram of one embodiment of an example system.

Turning next to FIG. 11, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

Various embodiments of the IC 10 and/or peripherals 154 may include power detect circuitry as discussed above. Furthermore, multiple instances of the power detect circuitry discussed above (and various embodiments thereof) may be implemented within system 150.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
a power detection circuit, wherein the power detection circuit includes:
a bandgap circuit configured to generate one or more output voltages based on an input voltage;
a switch control circuit configured to select a source of the input voltage to be provided to the bandgap circuit based on a level of a first supply voltage, wherein the switch control circuit is configured to select one of a second supply voltage or a third supply voltage as the source of the input voltage based on a level of the first supply voltage; and
a first comparator configured to compare the first supply voltage to at least one of the one or more output voltages; and
a power management circuit configured to perform one or more power control actions based on comparison results generated by the comparator.

2. The apparatus of claim 1, wherein the power detection circuit is configured to operate in an open loop configuration when the second supply voltage is selected as the source of the input voltage, and further configured to operate in a closed loop configuration when the third supply voltage is selected as the source of the input voltage.

3. The apparatus of claim 1, wherein the switch control circuit is configured to select the second supply voltage as the source of the input voltage in response to determining that the first supply voltage is less than a first threshold value, and further configured to select the third supply voltage as the source of the input voltage when the first supply voltage is greater than or equal to a second threshold value.

4. The apparatus of claim 3, wherein the switch control circuit includes:
a first voltage detection circuit configured to generate a switch control signal in either a first state or a second state; and
a second voltage detection circuit having a second comparator configured to generate an input signal provided to the first voltage detection circuit;
wherein the first and second voltage detection circuits are coupled to receive the first supply voltage, and wherein first voltage detection circuit is configured to hold the switch control signal in a first state in response to the first supply voltage being less than the first threshold value, irrespective of a state of an output of the second comparator.

5. The apparatus of claim 4, wherein the second voltage detection circuit is configured to cause the first voltage detection circuit to hold the switch control signal in the first state in response to the first supply voltage being greater than the first threshold and less than the second threshold, and further configured to cause the first voltage detection circuit to set the switch control circuit to the second state in response to the first supply voltage being greater than the second threshold.

6. The apparatus of claim 4, wherein the switch control circuit is configured to cause the second supply voltage to be provided to the bandgap circuit when the switch control signal is in the first state and further configured to cause the third supply voltage to be provided to the bandgap circuit when the switch control circuit is in the second state.

7. The apparatus of claim 4, wherein the second comparator includes first and second inputs, wherein the second voltage detection circuit is arranged such that a voltage on the first input changes as a linear function of the first supply voltage, and wherein a voltage on the second input changes as a non-linear function of the first supply voltage.

8. The apparatus of claim 1, further comprising a voltage multiplier configured to generate the second supply voltage by multiplying the first supply voltage.

9. The apparatus of claim 1, further comprising a low dropout (LDO) voltage regulator configured to generate the third supply voltage using the second supply voltage, wherein the LDO voltage regulator includes an error amplifier coupled to receive a reference voltage from the bandgap circuit.

10. The apparatus of claim 1, wherein the bandgap circuit includes:
a first bipolar transistor having a base terminal coupled to a ground node and an emitter terminal coupled to a first terminal of a first resistor;
a second bipolar transistor having a base terminal coupled to the ground node;
an amplifier having an inverting terminal coupled to an emitter of the second bipolar transistor, and a non-inverting input coupled to a second terminal of the resistor,
a first PMOS transistor having a drain terminal coupled to the second terminal of the resistor;
a second PMOS transistor having a drain terminal coupled to the emitter of the second bipolar transistor; and
a third PMOS transistor having a gate terminal coupled to respective gate terminals of the first and second PMOS transistors, wherein the bandgap circuit is configured to generate a bandgap voltage on a drain terminal of the third PMOS transistor.

11. The apparatus of claim 10, wherein the bandgap circuit further includes:
a current mirror including fourth, fifth, and sixth PMOS transistors;
a chopping circuit coupled to respective drain terminals of the fourth, fifth and sixth PMOS transistors; and
a sequence circuit configured to control a switching sequence of the chopping circuit, wherein the chopping circuit is configured to selectively couple an output of the amplifier and source terminals of the first, second and third PMOS transistors to terminals in the fourth, fifth, and sixth PMOS transistors in accordance with the switching sequence.

12. The apparatus of claim 11, further comprising a start-up circuit including:
a first circuit coupled to receive the first supply voltage;
a second circuit coupled to receive the second supply voltage; and
a delay circuit coupled to receive an input signal from the first circuit and provide an output signal to the second circuit, wherein the delay circuit is configured to, in response to the first supply voltage being less than a threshold, cause the output signal to be provided to the second circuit for a delay time, wherein the second circuit is configured to raise a bandgap voltage in the bandgap circuit in response to receiving the output signal.

13. The apparatus of claim 10, wherein the bandgap circuit further includes a switched capacitor filter configured to generate one of the one or more output voltages by filtering the bandgap voltage.

14. A method comprising:
selecting, in a power detection circuit, a source of an input voltage to be provided to a bandgap circuit, wherein the selecting is performed by a switch control circuit based on a level of a first supply voltage;

providing one of second supply voltage and a third supply voltage as the input voltage to the bandgap circuit based on the selecting;

generating, using a bandgap circuit, one or more output voltages based on the input voltage;

comparing the first supply voltage, using a comparator, to at least one of the one or more output voltages; and performing one or more power control actions based on comparison results generated by the comparator.

15. The method of claim 14, further comprising:

operating the power detection circuit in an open loop configuration when the second supply voltage is selected as the input voltage; and operating the power detection circuit in a closed loop configuration when the third supply voltage is selected as the input voltage.

16. The method of claim 14, further comprising:

generating the second supply voltage by multiplying the first supply voltage, using a voltage multiplier; and generating the third supply voltage using a low dropout (LDO) voltage regulator coupled to receive the second supply voltage.

17. A system comprising:

a power management circuit configured to perform at least one power control action in response to receiving an indication that an external supply voltage is less than a threshold voltage;

a power detection circuit configured to generate the indication and the threshold voltage, wherein the power detection circuit includes:

a bandgap circuit configured to generate the threshold voltage based on a received input voltage;

a voltage multiplier configured to generate, using an external supply voltage, a multiplied supply voltage that is greater than the external supply voltage;

a voltage regulator configured to generate a regulated supply voltage using the external supply voltage; and a switch control circuit configured to select one of the multiplied supply voltage and the regulated supply voltage as the received input voltage; and a comparator configured to compare the external supply voltage to the threshold voltage and further configured to generate the indication.

18. The system of claim 17, wherein the switch control circuit is configured to select the multiplied supply voltage as a source of the input voltage in response to determining that the external supply voltage is less than a first threshold value, and further configured to select the regulated supply voltage as the source of the input voltage when the external supply voltage is greater than or equal to a second threshold value.

19. The system of claim 18, wherein the switch control circuit is configured to cause the power detection circuit to operate in an open loop configuration when the multiplied supply voltage is selected as the source of the input voltage, and further configured to cause the power detection circuit to operate in a closed loop configuration when the regulated supply voltage is selected as the source of the input voltage.

20. The system of claim 17, wherein the voltage regulator is a low dropout (LDO) voltage regulator configured to generate the regulated supply voltage using the multiplied supply voltage, wherein the LDO voltage regulator includes an error amplifier coupled to receive a reference voltage from the bandgap circuit.

* * * * *